(12) United States Patent
Nicolaides et al.

(10) Patent No.: US 9,709,386 B1
(45) Date of Patent: Jul. 18, 2017

(54) APPARATUS AND METHODS FOR MEASURING PROPERTIES IN A TSV STRUCTURE USING BEAM PROFILE REFLECTOMETRY

(71) Applicant: KLA-Tencor Corporation, Milpitas, CA (US)

(72) Inventors: Lena Nicolaides, Castro Valley, CA (US); Timothy Goodwin, Mountain View, CA (US); Raul V. Tan, San Jose, CA (US); Shifang Li, Pleasanton, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/091,522

(22) Filed: Apr. 5, 2016

(51) Int. Cl.
*G01B 11/28* (2006.01)
*G01B 11/06* (2006.01)

(52) U.S. Cl.
CPC ................ *G01B 11/0641* (2013.01)

(58) Field of Classification Search
CPC ...... G01B 11/28; G01B 11/06; G01B 11/0608

USPC .......................................................... 356/630
See application file for complete search history.

(56) References Cited

U.S. PATENT DOCUMENTS

2016/0377412 A1\* 12/2016 Li ...................... G01B 11/0608
356/630

\* cited by examiner

*Primary Examiner* — Roy M Punnoose
(74) *Attorney, Agent, or Firm* — Kwan & Olynick LLP

(57) ABSTRACT

Disclosed are methods and apparatus for measuring a characteristics of a through-silicon via (TSV) structure. A beam profile reflectivity (BPR) tool is used to move to a first xy position having a TSV structure. The BPR tool is then used to obtain an optimum focus of at the first xy position by adjusting the z position to a first optimum z position for obtaining measurements at the first xy position. Via the BPR tool, reflectivity measurements for a plurality of angles of incidence are obtained at the first xy position. One or more film thicknesses for the TSV structure are determined based on the reflectivity measurements. A z position can also be recorded and used to determine a height of such TSV structure, as well as one or more adjacent xy positions.

17 Claims, 8 Drawing Sheets

ND METHODS FOR
APPARATUS AND METHODS FOR MEASURING PROPERTIES IN A TSV STRUCTURE USING BEAM PROFILE REFLECTOMETRY

TECHNICAL FIELD OF THE INVENTION

The invention generally relates to the field of wafer metrology and inspection systems. More particularly the present invention relates to metrology techniques for TSV (Through-Silicon Via) structures.

BACKGROUND

Generally, the industry of semiconductor manufacturing involves highly complex techniques for fabricating integrating circuits using semiconductor materials that are layered and patterned onto a substrate, such as silicon. An integrated circuit is typically fabricated from a plurality of reticles. Generation of reticles and subsequent optical inspection of such reticles have become standard steps in the production of semiconductors. The fabrication of semiconductor devices, such as logic and memory devices, typically includes processing a semiconductor wafer using a large number of semiconductor fabrication processes with multiple reticles to form various features and multiple levels of the semiconductor devices. Multiple semiconductor devices may be fabricated in an arrangement on a single semiconductor wafer and then separated into individual semiconductor devices.

If there are defects on the reticle or wafer, the resulting semiconductor devices may not function properly. Additionally, various structures on the wafer need to meet predefined specifications or be monitored for quality control purposes. Therefore, there is a continuing need for improved measurement mechanisms.

SUMMARY

The following presents a simplified summary of the disclosure in order to provide a basic understanding of certain embodiments of the invention. This summary is not an extensive overview of the disclosure and it does not identify key/critical elements of the invention or delineate the scope of the invention. Its sole purpose is to present some concepts disclosed herein in a simplified form as a prelude to the more detailed description that is presented later.

An apparatus and method for measuring a characteristics of a through-silicon via (TSV) structure are disclosed. A beam profile reflectivity (BPR) tool is used to move to a first position, (x,y), having a TSV structure. The BPR tool is then used to obtain an optimum focus of at the first position, (x,y), by adjusting the z position to a first optimum z position for obtaining measurements at the first position, (x,y). Via the BPR tool, reflectivity measurements for a plurality of angles of incidence (AOI) are obtained at the first position (x,y). One or more film thicknesses on the TSV structure are determined based on the reflectivity measurements. A z position can also be recorded and used to determine a height of such TSV structure, as well as one or more adjacent positions, (x, y).

In a specific implementation, the first optimum z position from a stage encoder of the BPR tool is recorded. The BPR tool is used to move to a second position, (x,y) adjacent to the TSV structure. The BPR too is then used 1 to obtain an optimum focus at the second position, (x,y), by adjusting the z position to a second optimum z position for obtaining measurements at the second position, (x,y). The second optimum z position from the stage encoder of the BPR tool is also recorded. Via the BPR tool, reflectivity measurements for a plurality of angles of incidence are obtained at the second xy position. One or more film thicknesses for the second position, (x,y), that is adjacent to the TSV structure are determined based on the reflectivity measurements. A height difference between the TSV structure and the second position, (x,y), is determined based on the recorded first and second optimum z positions and the film thicknesses determined for the first and second (x,y) positions. In one aspect, the measurements for the first and second (x,y) positions are obtained for s and p polarizations. In another aspect, the film thicknesses for the first and second (x,y) positions are determined by solving for a set of Fresnel coefficients in a set of Fresnel equations that each relates reflectivity, angle of incidence, and thickness. In a further aspect, solving for the set of Fresnel coefficients includes employing a least squares fitting routine to the set of Fresnel equations and correcting for absorption characteristics of one or more films at the first and second (x,y) positions.

In another embodiment, for a plurality of adjacent (x,y) positions, the following operations are repeated: the operations for using the BPR tool to move, using the BPR tool to obtain an optimum focus, recording an optimum z position, obtaining reflectivity measurements, determining one or more film thicknesses, and determining height differences so as to obtain a roughness metric for the plurality of adjacent (x,y) positions. In a further aspect, the adjacent (x,y) positions cover an area between about 5-10 microns by 5-10 microns or more.

In an alternative embodiment, the invention pertains to a beam profile reflectivity (BPR) system for measuring a characteristics of a through-silicon via (TSV) structure. The system includes an illumination optics module for generating and directing an incident beam towards a sample at a plurality of angles of incidence, a collection optics module for obtaining reflectivity measurements from the sample in response to the incident beam, and a controller that is configured to perform one or more of the above-described method operations.

In another implementation, a cluster system for performing metrology and inspection on a sample is disclosed. The cluster system includes an inspection tool for inspecting a sample for defects, any of the above-described BPR system embodiments, and a wafer handling system for moving one or more samples between the inspection tool and the BPR system. In another embodiment, the cluster system includes a processing tool for performing a fabrication process on a sample, and the wafer handling system is configured to move samples to and from the processing tool.

These and other aspects of the invention are described further below with reference to the figures.

DETAILED DESCRIPTION OF EXAMPLE EMBODIMENTS

In the following description, numerous specific details are set forth in order to provide a thorough understanding of the present invention. The present invention may be practiced without some or all of these specific details. In other instances, well known component or process operations have not been described in detail to not unnecessarily obscure the present invention. While the invention will be described in conjunction with the specific embodiments, it will be understood that it is not intended to limit the invention to the embodiments.

The metrology and inspection techniques described herein may be implemented with respect to any suitable specimen. One example specimen is a semiconductor structure from which film thickness may be measurable, such as a through-silicon via (TSV) structure. Specimens can also take the form of a semiconductor reticle, a solar panel, a computer disk, etc.

A TSV process is typically used to electrically isolate copper vias. A TSV typically passes completely through the wafer or die. TSVs utilize interconnect techniques provide an alternative to other interconnect techniques, such as wire-bond or flip chips. TSV interconnects can have relatively higher density and provide a relatively shorter connection length, for example, from a chip to a circuit board.

Figure 1A:
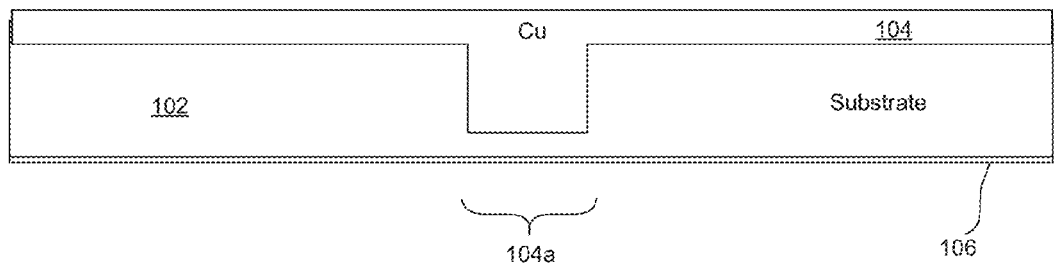
FIG. 1A is a diagrammatic side view of a through-substrate via (TSV) process that includes deposit of an interconnect layer over a substrate and within a via.
Figure 1B:
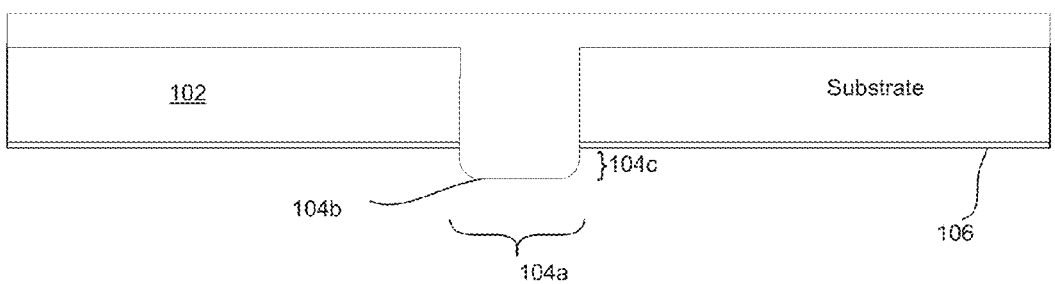
FIG. 1B is a diagrammatic side view of a TSV process after back etching the substrate.

FIG. 1A is a diagrammatic side view of a TSV process. As shown, an interconnect material 104, such as Cu, is deposited over a substrate 102 and within a via portion 104a. The via may be formed by any suitable process, such as drilling or etching through the silicon. The via may be any suitable dimension, such as 100 to 200 µm deep and 50-100 µm diameter. The substrate is then back-etched to expose a portion of the interconnect material so as to form a through-silicon via (TSV) as shown in FIG. 1B. The substrate 102 may initially have a thickness of about 750 µm, and then be etched to expose the Cu in the via.

In one embodiment, the substrate 102 is a silicon wafer substrate. In other examples, the substrate may contain any suitable bulk semiconductor material, such as germanium, silicon carbide, indium arsenide, gallium arsenic, indium phosphate, etc. The substrate 102 may also include an epitaxial layer over the bulk semiconductor material. The epitaxial layer may be in the form of a germanium layer over the bulk silicon or another silicon layer overlying the bulk silicon germanium.

The substrate 102 may also include other buried structures or doped portions. Additionally, other semiconductor, insulating, and conductive layers may be patterned on the substrate 102 and interconnect TSV layer 104. The doped regions and other patterned materials together form various devices (such as metal insulator semiconductor field effect transistor (MOSFET) devices), isolation features (such as dielectric isolation features, such as shallow trench isolation or STI structures), etc.

As shown in FIG. 1B, the Cu portion 104b of the TSV 104a is exposed on the backside of the substrate 102. This TSV 104a and its exposed portion 104b may have various problems that are preferably detected and monitored closely since interconnect issues may adversely affect device function. For example, the via hole may be drilled so that the via is tilted and not perpendicular to the substrate surface. The TSV 104a may have an irregular shape, contain voids, or have roughness on its exposed portion 104b.

Figure 1C:
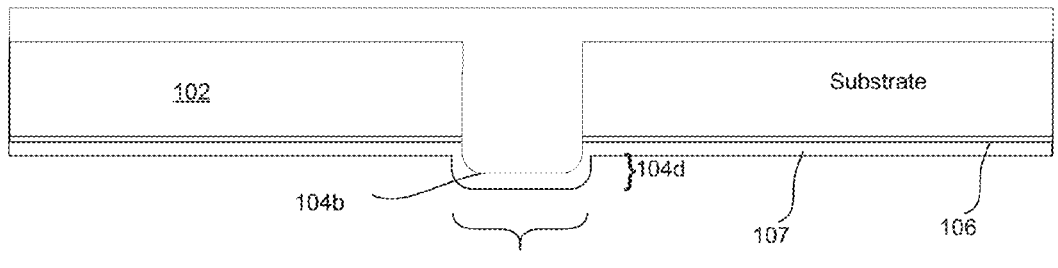
FIG. 1C is a diagrammatic side view of a TSV process after back etching the substrate and deposition of a film over the TSV structure.

FIG. 1C is a diagrammatic side view of a TSV process after back etching the substrate and deposition of a film 107 over the TSV structure. As shown, the TSV structure is no longer exposed, but covered with film 107. In one example, this film 107 is a dielectric film which is deposited over the TSV structures of the wafer in the middle of process to build the final device and form TSV dielectric caps, e.g., having height 104d.

One metrology goal may be to characterize the amount that the Cu extends past the wafer's backside (or a measurement of 104c). That is, the height of this extent 104c often needs to be within strict specifications. Another goal may be to measure the extent of the TSV cap (e.g., 104d).

Figure 2:
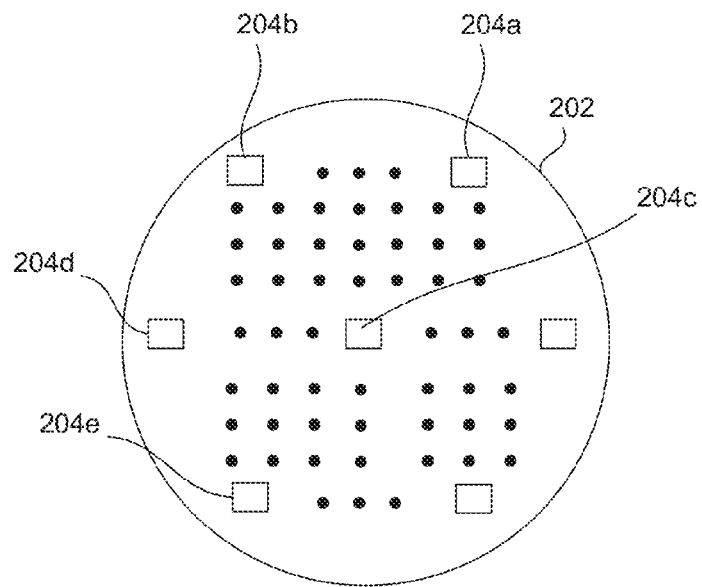
FIG. 2 is a diagrammatic top view of a wafer having multiple dies with multiple TSV interconnects on their backside

FIG. 2 is a diagrammatic top view of a wafer 202 having multiple dies (such as 204a-e) that each have multiple TSV interconnects on their backside (not shown). The different dies or die portions may have different associated TSV characteristics, such as differences in the aforementioned TSV extent 104c or 104d. For instance, one die 204a may have TSV's that do not extend all the way through the substrate. Another die 204b may have TSV's that extend a small distance from the back side surface, while another die 204c may have TSV's that extend a larger amount from the back surface.

Measuring the height of the TSV's extent may be accomplished using a profile type of metrology tool, such as the Micro3000 metrology module from KLA-Tencor of Milpitas, Calif. This tool measures the difference in focus points and the tools corresponding z direction movement to determine the extent of each TSV. Although measuring such extents is a slow process with this type of tool, such measurements may be easily obtained when the TSV extends through only a silicon substrate. However, measurement problems may occur when the backside of the silicon substrate is also coated with one or more layers of different materials (e.g., 106 of FIG. 1B), which may make it difficult to determine the focus point for the different film coating(s) (e.g., 106) relative to the focus point on the TSV's exposed surface (104b). For instance, some of the films may be transparent, while other films are opaque to the optical incident light from the metrology tool.

Figure 3:
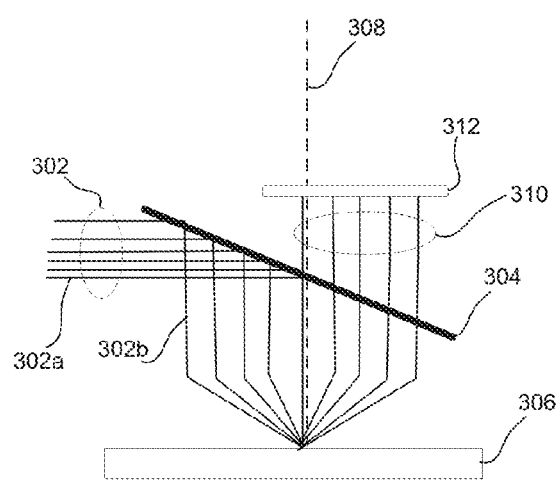
FIG. 3 is a diagrammatic representation of the incident and output rays in a beam profile reflectometry (BPR) tool in accordance with one embodiment of the present invention.

Certain embodiments of the present invention utilize a beam profile reflectometry (BPR) tool to measure characteristics of TSV structures. FIG. 3 is a diagrammatic representation of the incident and output rays in a BPR tool in accordance with one embodiment of the present invention.

In the typical BPR tool, one or more lens (e.g., beam splitter 304) serve to collimate and focus the incident light 302 over a spot on the sample 306. The incident beam 302 may be focused substantially normal to the surface of the sample 306 in order to minimize the spot size and maximize resolution.

The individual rays of the incident beam 302 will have a different angle of incidence, which depends on the numerical aperture of the illumination lens. In one BPR system, the numerical aperture is large, such as 0.9, so as to cause the arriving incident rays to be incident on the sample 306 with a wide range of angles such as about 0 to 65°. Each ray of light is incident on the wafer with a certain angle. This angle depends on the position of the ray in the beam. For instance, the reflected ray 302a reflects off the beam splitter 304 as a normal angle with respect to the surface of the sample 306. The normal angle (0 degrees) corresponds to an axis 308 that is perpendicular to the sample surface. Other incident rays, such as 302b have a larger incident angle for hitting the sample surface. These rays of light have a large range of angles of incidence on the sample, In this figure, one ray (center of the beam) has the angle of incidence 0° (vertical on the wafer), and the other rays have higher angles of incidence, such as 50°. In one implementation, the wavelength of light is about 6730 Å.

The output light rays 310 reflected from the sample 306 pass through one or more lens (e.g., beam splitter 304) and are collected by one or more detectors, such as detector array 312. The array detector is configured to detect rays as a function of angle of incidence. That is, each pixel position that is imaged on the sample by an incident ray at a particular angle of incidence corresponds to a detected pixel on the array detector. That is, each detected pixel will correspond to a different angle of incidence. For example, there may be 512 pixel measurements, with each pixel being a measurement of the reflectivity as a function of angle of incidence.

Figure 4:
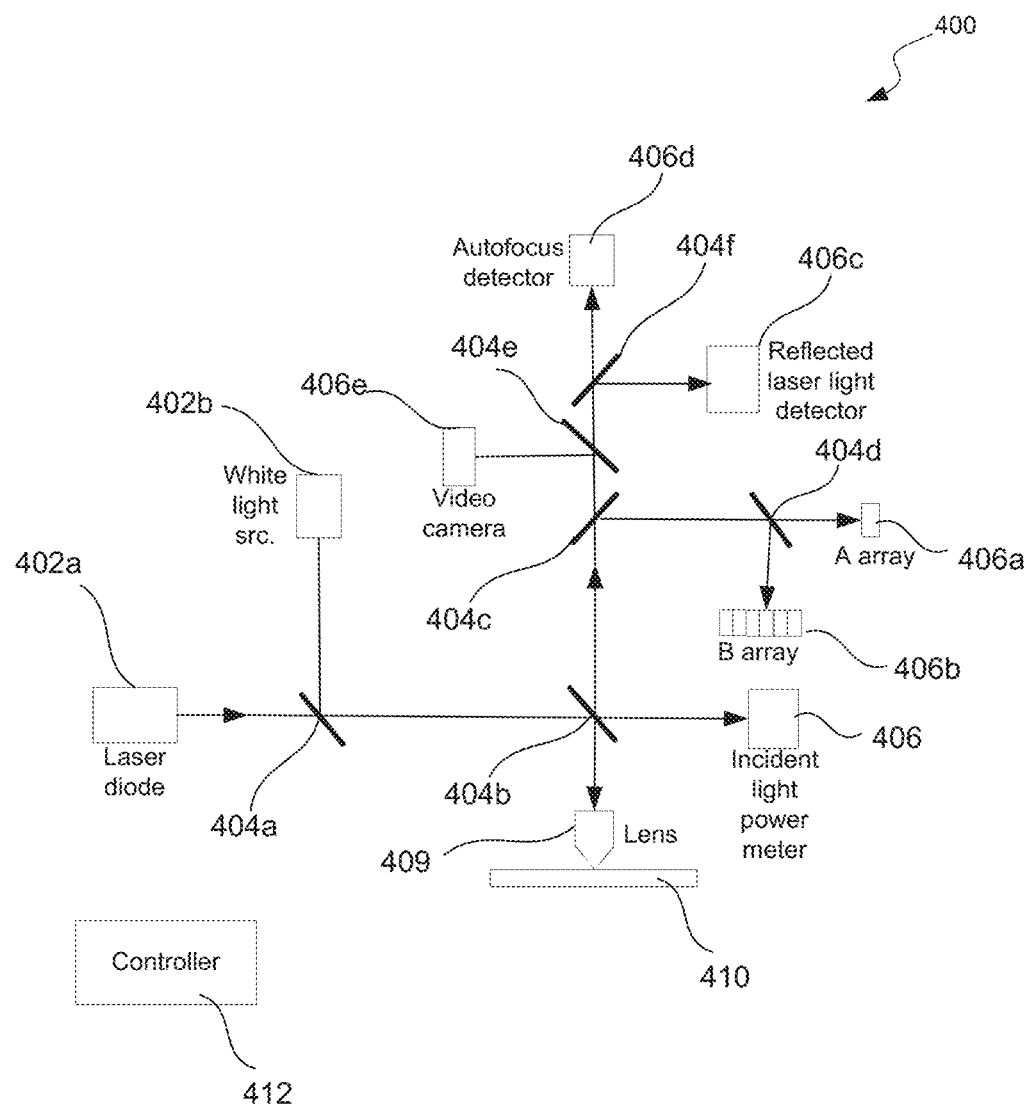
FIG. 4 is a detailed diagrammatic representation of a beam profile reflectometry (BPR) tool in which techniques of the present invention may be implemented.

FIG. 4 is a detailed diagrammatic representation of a beam profile reflectometry (BPR) tool 400 in which techniques of the present invention may be implemented. The system 400 may include one or more light sources (e.g., 402a and 402b) for directing light towards a sample 410. Any suitable number and type of light sources may be implemented. For example, light source 402a may be in the form of a laser diode (e.g., 673 nm), and light source 102b may take the form of a white light source.

The incident light may be passed through any suitable type and number of beam splitters and lenses (e.g., 404a, 404b, 409), which are constructed, sized, and shaped so as to direct and focus a plurality of different angles of incident onto a particular spot of the sample 410. In one application, the laser light source 402a generates a 673 nm or lower ray bundle having multiple angles of incidence that is then collimated and focused onto sample 410.

The system 400 may also include any suitable number and type of beam splitters and lenses (e.g., 404b, 404c, 404d, 404e, 404f) for directing output light, which is reflected from the sample 410 in response to the incident beam, onto one or more detectors or sensors (e.g., 406a, 406b, 406d, 406e). For instance, the detectors may take the form of A-array detector 406a, B-array detector 406b, reflected laser light detector 406c, autofocus detector 406d, and video camera 406e. The A-array and B-array detectors may be arranged to collect both S and P polarity from the reflected light (e.g., A-array is perpendicular to B-array). The autofocus detector is used to detect if the sample is positioned at the focal point of the laser beam. The autofocus signal is used to move a z-stage until a preset autofocus signal is found. The system 400 may also include an incident light power meter 406f.

The system 400 may also include controller 412, which serves to control various components of the system. For instance, the controller 412 may include one or more processors and memory. The controller's processor(s) and memory may be programmed to control and adjust various settings of the system. Each processor typically may include one or more microprocessor integrated circuits and may also contain interface and/or memory integrated circuits and may additionally be coupled to one or more shared and/or global memory devices. The controller's processor(s) and memory may also be configured to receive output signals or images from the detectors and analyze such data for defect detection or metrology purposes.

The controller may also include a positioning mechanisms for moving the stage upon which the sample is placed. The autofocus module and controller's positioning mechanism may work together to position the sample stage to achieve an optimal focus. The illumination optics column may be moved in an x, y, and/or z direction respect to the stage and/or the stage moved in an x, y, and/or z direction relative to the optics column by any suitable mechanism so as to scan patches of the reticle. For example, a motor mechanism may be utilized to move the stage. The motor mechanism may be formed from a screw drive and stepper motor, linear drive with feedback position, or band actuator and stepper motor, by way of examples.

The positioning mechanism also generally includes one or more encoders that can be read in order to determine the x, y, or z position of the stage and sample, which are then used to determine a TSV height as further described herein.

Figure 5:
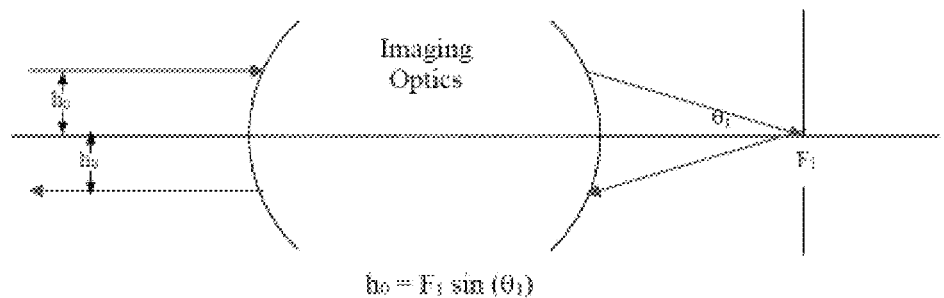
FIG. 5 illustrates the high magnification imaging optics for a BPR system in accordance with one application of the present invention.

The array detectors may be used to measure light corresponding to each incident angle or small set of incident angles, as well as corresponding to linear s- and p-polarized light. For instance, each array pixel may detect light reflected or scattered from the sample in response to an incident beam striking such sample at a particular angle of incidence. FIG. 5 illustrates the high magnification imaging optics for a BPR system in accordance with one application of the present invention. For instance, the system magnification is configured to be 100×. Where $h_0$ is the height of a parallel ray of light above the principle optical axis, $F_1$ is the focal point, and $\theta_1$ is the angle of the ray that passed through $h_0$ when passing through $F_1$ (e.g., lens 410). For the BPR, the light from the sample surface passes again through the high magnification lens, which bends the light ray back to parallel. The distance $h_0$ from the center of the laser spot, the angle, $\theta_1$ and effective focal length, $F_1$ follow the equation:

$$h_0/F_1 = \sin(\theta_1)$$

In a BPR system, there may be an additional relay lens that magnifies the image of the laser cross section. If M is the magnification factor and $D_p$ is the distance from the center of the magnified laser spot at the pixel array, then $h_0 = D_p/M$.

$$D_p = \text{Pixel \# (from center)} \times PW \text{ (Pixel width), thus:}$$

$$(\text{Pixel \#}) \times (PW)/(M \times F_1) = \sin \theta_1$$

Since the term $(PW)/(M \times F_1)$ tends to be constant for each array, two terms, $\alpha$ for the A array and $\beta$ for the B array, may be defined:

For the A-array: (Pixel # from center of A array) × 0.01 × $\alpha = \sin(\theta_A)$ For the B-Array: (Pixel # from center of B array)×
0.01×β=sin(θ$_B$)

The numerical aperture (NA) for a lens is related to the largest angle at which light is focused for a lens system.

For the A-array: NA=(Maximum Pixel # from center
of A array−1)×0.01×α=Sin(θ$_{Max}$)

For the B-Array: NA=(Maximum Pixel # from center
of B array−1)×0.01×β=Sin(θ$_{Max}$)

The minimum allowable numerical aperture for the BPR may be selected to be about 0.84, by way of example.

The BPR technology can be used to measure the polarized reflectance of a surface as function of incident angle by imaging the back focal plane of a high NA (typically 0.95) objective onto array detectors. The angle variation functions can also be measured at a given wavelength to provide rich information so as to determine film thicknesses and other optical properties without need of a model or consideration of any assumptions. Due to the high NA and use of a laser source, the BPR system also has a very high spatial resolution (~0.5 µm) and, thus, can provide adequate accuracy to also measure a rough surface in which the thicknesses of films vary on a microscopic scale. Due to the high spatial resolution and fast measurement speed of a BPR system, an area on the surface can be scanned to find the thickness variation across the scanned area. Thus, the actual surface roughness can be measured and resolved. Each layer's contribution to such thickness variation can also be determined. Again due to the high NA design, the BPR system may provide a very accurate height sensitivity. In one implementation, the autofocus (AF) mechanism is also constructed with the light passing through the objective with a high degree of accuracy.

Figure 6:
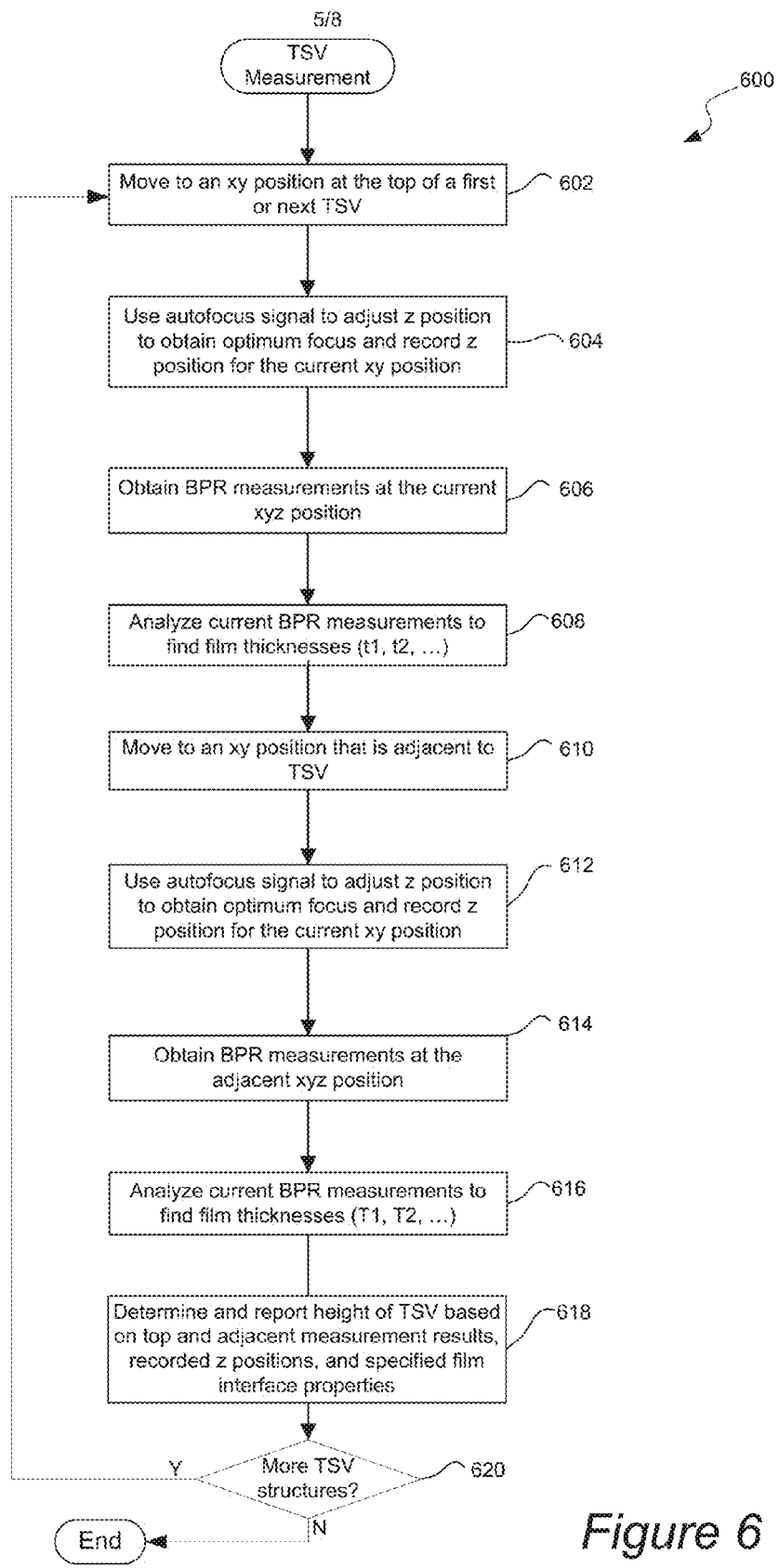
FIG. 6 is a flow chart illustrating a procedure for determining TSV metrics in accordance with a specific implementation of the present invention.

Any suitable technique may be implemented for using the BPR system to measure a TSV characteristic, such as its height (e.g., 104c or 104d) relative to the surrounding film surface (e.g., 106 or 107). FIG. 6 is a flow chart illustrating a procedure 600 for determining TSV metrics in accordance with a specific implementation of the present invention. Initially, the process 600 includes moving to an xy position at the top of a first TSV in operation 602. For instance, the beam path is moved relative to the first TSV structure on the sample so as to impinge on the first TSV (sample and/or beam column optics moved). The locations of each TSV structure may be provided by the designers (e.g., in a GDSII file) and entered into the inspection tool, which automatically moves to a first TSV location or an operator manually causes such movement of the inspection tool to a first location.

An autofocus signal may then be used to adjust a z position to obtain an optimum focus in operation 604. For instance, part of the output beam may be received into the autofocus detector (e.g., 406d) and used to generate autofocus signal that is analyzed to determine whether the z position is to be adjusted to achieve a more optimum focus. A particular z position may be achieved by moving the stage up and down via a positioning mechanism (e.g., 412). Optimum focus may be achieved, for example, when balanced the signal of a bi-cell detector that is placed after a knife edge chopper at desired focal position of the reflected laser beam. The z position may also be recorded in operation 604. For instance, an encoder xyz position (located on the stage) may be read and recorded/stored in memory for later use in association with the current TSV.

BPR measurements at the current xyz position are then obtained in operation 606. That is, BPR measurements at different angles of incidence are obtained. These BPR measurements are then used to find film thicknesses (e.g., t1, t2, . . . etc.) for one or more films at the xy position in operation 608. For instance, a linear array detector may be operable to detect 512 pixels or 512 measurements at different angles of incidence. That is, reflectivity is measured as a function of angle of incidence, and these reflectivity measurements are then analyzed together to determine film thickness value(s).

Figure 7A:
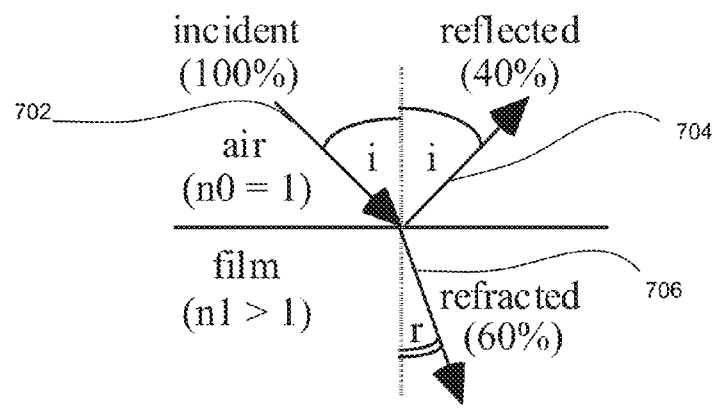
FIGS. 7A through 7H illustrate a process for determining film thickness using a BPR system.

Any suitable technique may be utilized to find film thicknesses from BPR measurements. FIGS. 7A through 7H illustrate a process for determining film thickness using a BPR system. For a single interface between air and a film, FIG. 7A illustrates that some of the incident light (702) is reflected at the interface air/film as reflected light (704), and some of it is refracted into the film as refracted light (706). The reflected light (704) plus the refracted light (706) equals the incident light (702). Additionally, the ratio of the reflected light and the refracted light depends on the angle of incidence, the index n1 of the film, and the plane of incidence. In this case, the index n1 is greater than 1; the reflected light is 40% and the light refracted light is 60% for a given angle i and a given plane of incidence.

Figure 7B:
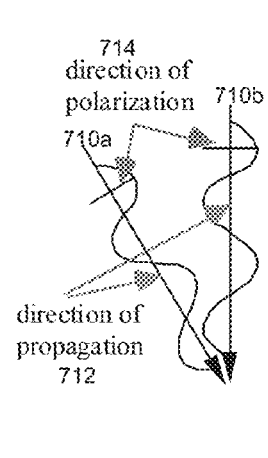

A ray of light can be represented as a wave, which has a vibration or oscillation component. This oscillation is always perpendicular to the direction of propagation as shown in FIG. 7B for incident beams 710a and 710b, having directions of propagation 712 and directions of polarization 714. Additionally, the period of the oscillation in space is the light wavelength. An ordinary ray of light is not polarized. That is, this ordinary non-polarized ray has oscillations that occur randomly in all possible planes containing the direction of propagation.

Figure 7C:
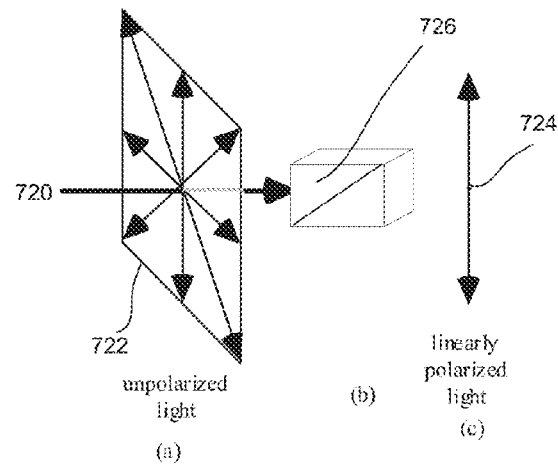

FIG. 7C shows a ray of non-polarized light 720 propagating perpendicularly to a plane 722. The arrows (shown on the plane 722) symbolize some of the directions of the oscillations. A ray of linearly polarized light has oscillations in one plane only (e.g., 724). A polarizer turns an unpolarized light into a linearly polarized light. An analogy is a thin parallel wire grid, through which the unpolarized light passes. The light polarized parallel to the wires are absorbed, so that the transmitted light has only a polarized component perpendicular to the wires. The wire grid polarizer is a classic polarizer, and other types of polarizers, such as those based on birefringence crystals or thin film coatings, are available and can be used. Examples include a Glan-Thomson polarizer or a cube polarizer (e.g., 726 of FIG. 7C).

Figure 7D:
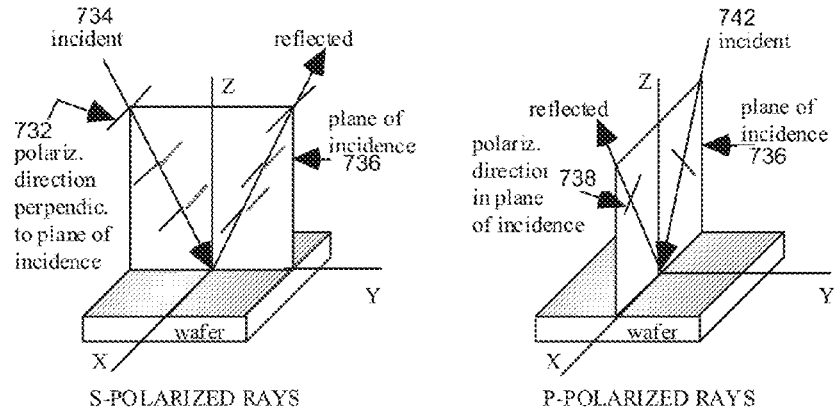

If the plane of incidence is perpendicular to the polarization direction (i.e., the oscillations are in a plane perpendicular to the plane of incidence), then the plane of incidence is called an s-plane, and the ray is said to be s-polarized. FIG. 7D shows an s-polarized direction 732 for incident beam 734 in plane of incidence 736. If the plane of incidence 736 of another incidence beam 742 contains the polarization direction, 738, (i.e., the light vibrates in the plane of incidence 736), then the plane of incidence (736) of the incident beam (742) is a p-plane, and the ray is said to be p-polarized.

Figure 7E:
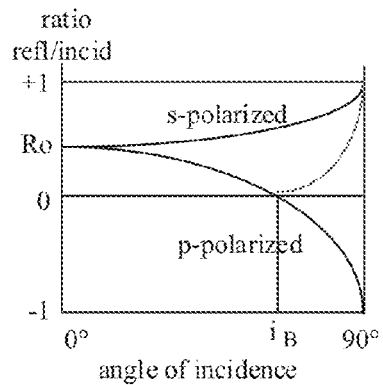

FIG. 7E represents the theoretical variation of the ratio of the (reflected amplitude)/(incidence amplitude) as a function of angle of incidence. Note that, for the angle of incidence 0° (vertical ray), the reflected amplitudes for the s and p polarizations are the same (refl/incid=Ro). For the s-polarized light, the intensity of the reflected light increases with the angle of incidence. For the p-polarized light, the intensity first decreases and then increases.

The Brewster's angle (iB) is the angle of incidence for which the reflected intensity is equal to 0 for the p-polarized rays. While the amplitudes can change sign and become negative, the intensities (the intensity=square of the amplitude) measured by the BPR system are always positive. The dotted curve in FIG. 7E corresponds to what the BPR system effectively measures.

Figure 7F:
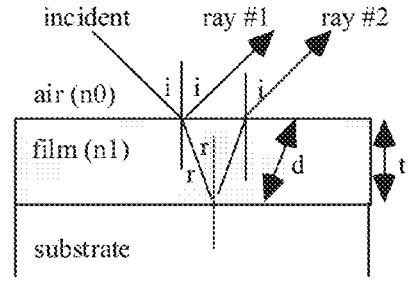
Figure 7G:
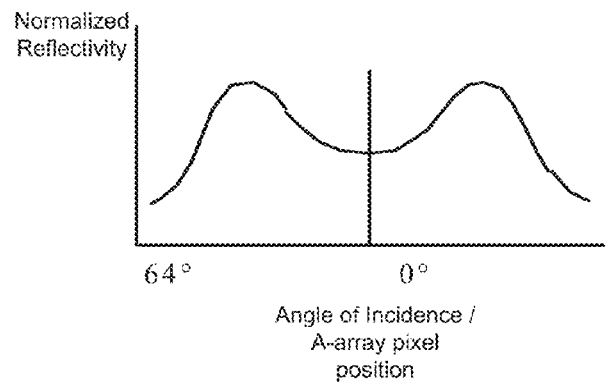

At the Brewster's angle, no p-polarized light is reflected by the film and all the p-polarized incident light is refracted into the film, which is then reflected by the substrate and comes out as ray #2. For thin film, the displacement between ray #1 and #2 is very small and has superposition with each other coherently. For this angle of incidence, iB, reflected ray #1 is not present. However, as explained below, the BPR system measures and simulates ray #1, ray #2 and all sequential reflected rays to determine the film thickness as illustrated in FIG. 7F.

The Brewster's angle generally depends on the index of air and the index of the film in the following relationship:

$$\tan(iB) = n1/n0$$

The value at this angle provides information on the index n1 of the film. For the interface air/oxide, iB=55°. For air/nitride: iB=63°, and for air/polySi: iB=75°.

Light can be described by a wave or oscillation. Each wave has an amplitude, a wavelength and a phase. Next, two interfaces in the form of air/film and film/substrate will be considered as illustrated in FIG. 7F. Ray #1 is the ray that is reflected at the top interface, and ray #2 is the ray that is refracted into the film, reflected from the substrate, and out of the top interface.

After leaving the film, the reflected rays #1 and #2 are parallel (same angle i). Because the film thickness t is small (e.g., 1 μm) in this example, the two rays are practically in coincidence. If a detector collects both reflected rays, it would measure the sum of their oscillation amplitudes.

Ray #2 traveled a longer distance (2d inside the film for center ray) than ray #1. The extra travel (2d) was inside the film. This travel distance is traversed by ray #2 at a slower speed than in air because of the higher film refractive index n1. This extra travel distance, as a result, causes a delay between the oscillation phases of the two rays. At a given point where ray #1 and ray #2 travel parallel to each other outside the sample, the maximum amplitude of ray #1 may not coincide with the maximum amplitude of ray #2. That is, they may not be oscillating in phase.

Ray #1 and ray #2 are in phase if their phase difference is a multiple of the period of the light wave. The sum of the two rays #1 and #2 is then maximum: amplitude ray #1+amplitude ray #2 (constructive interference). In contrast, ray #1 and ray #2 are in opposition of phase if the oscillation of ray #1 is at its maximum when the oscillation of ray #2 is at its minimum. In this later case, the sum of the two rays #1 and #2 is at a minimum: amplitude ray #1−amplitude ray #2 (destructive interference).

This phase delay depends on the length 2d of the extra travel, the velocity v of light propagation in the film, the incident angle, and the wavelength of the light. The extra travel distance 2d, in turn, depends on the thickness t of the film and on the angle r, with r being related to the angle i (Snell's rule). The velocity v of propagation of the light wave in the film is:

$$v = c/n1$$

where c is the light velocity in the vacuum (or in air) and n1 is the film index.

In the film, ray #2 travels at a slower velocity than in air. The period of the wave in space varies like the velocity. The larger the index, the smaller the velocity and the smaller the period in space. The intensity of the reflected light depends on the angle of incidence i of the light, the film refractive index n, the film extinction coefficient k, the film thickness t, the wavelength λ of the light, and the polarization of light.

In summary, the incident angle for light depends on which part of the lens is used to focus light. The BPR system generally focuses a collimated, cylindrical beam of incident light rays that are focused down to a 0.9 or 0.7 micron sized spot over a range of incident angles. Since reflected angle equals incident angle, the output lens also collimates the reflected light beam. Incident light is both reflected and refracted at each interface, and the angles of reflection and refraction at each interface depend on the corresponding incident angle. For each incident angle, thin film interference determines the measured reflected intensity. Since the incident beam is also linearly polarized, the polarization direction (S, P, or mixed) can then be selected by choosing a particular plane which bisects the incident or reflected beam. The A- and B-arrays can then be oriented to detect light which is only S polarized and only P polarized, respectively. The resulting signal is reflectivity versus angle as shown, for example, in FIG. 7G for the A-array or s-polarized reflectivity.

Figure 7H:
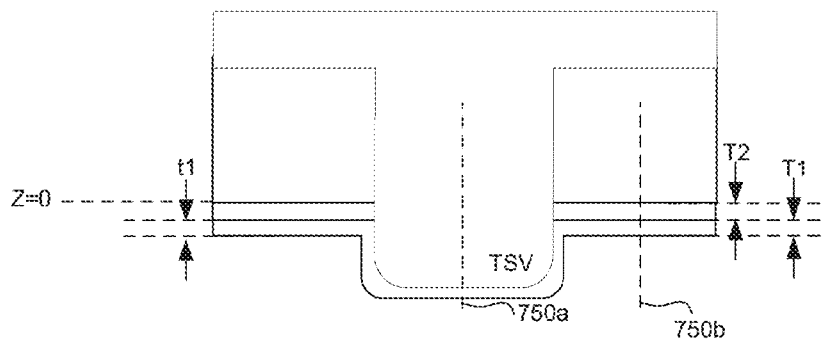

These reflectivity measurements at the different angles of incident can then be used to determined one or more film thickness values. For instance, as shown in FIG. 7H, thickness t1 at xy position 750a (on the top of the TSV post) can be determined. Any suitable technique may be used, such as solving for the Fresnel coefficients. Information about layer thickness is specifically derived using the measured reflectance information in a mathematical model or set of equations which relate reflectivity, angle of incidence and layer thickness. The equations utilized are based on the well-known Fresnel equations. The principal equation for the reflectivity of a sample with respect to S polarized light is as follows:

$$R_S = \left| \frac{r_{S1} + r_{S2} \cdot e^{i2k_1 t}}{1 + r_{S1} \cdot r_{S2} \cdot e^{i2k_1 t}} \right|^2 \qquad \text{Equation [1]}$$

where $R_S$ is the reflectivity of the light derived from the isolated intensity measurement, the index of refraction in air is taken as one and t is the thickness of the layer. The constant k in Equation [1] is given by the formula:

$$k_1 = \frac{2\pi}{\lambda} n_L \cos\theta_L \qquad \text{Equation [2]}$$

where λ is the wavelength of the laser beam. All r values are for the reflectivity of s-polarized light where $r_{S1}$ is the reflectance from the top surface of thin film layer and $r_{S2}$ is the reflectance from the interface between film and the substrate.

For S polarized light, the reflectivity from the surface thin film layer ($r_{S1}$) and the substrate ($r_{S2}$) are given by the following equations:

$$r_{S1} = \left( \frac{n_L \cos\theta_L - \cos\theta_O}{n_L \cos\theta_L + \cos\theta_O} \right) \qquad \text{Equation [3]}$$

$$r_{S2} = \left(\frac{n_S\cos\theta_S - n_L\cos\theta_L}{n_S\cos\theta_S + n_L\cos\theta_L}\right) \quad \text{Equation [4]}$$

where $n_L$ is the index of refraction of the thin film layer, $n_S$ is the index of refraction of the substrate, $\theta_O$ is the angle of incidence at the interface between the air and surface of the thin film layer, $\theta_L$ is the angle of incidence in the thin film layer and $\theta_S$ is the angle of incidence in the substrate.

For P polarized light, the reflectivity from the surface of the thin film layer ($r_{P1}$) and the substrate ($r_{P2}$) is given by the following equations:

$$r_{P1} = \left[\frac{\frac{n_L}{\cos\theta_L} - \frac{1}{\cos\theta_O}}{\frac{n_L}{\cos\theta_L} + \frac{1}{\cos\theta_O}}\right] \quad \text{Equation [5]}$$

$$r_{P2} = \left[\frac{\frac{n_S}{\cos\theta_S} - \frac{n_L}{\cos\theta_O}}{\frac{n_S}{\cos\theta_S} + \frac{n_L}{\cos\theta_O}}\right] \quad \text{Equation [6]}$$

The detected reflectivity of p-polarized light is $$R_P = \left|\frac{r_{P1} + r_{P2}\cdot e^{i2k_1t}}{1 + r_{P1}\cdot r_{P2}\cdot e^{i2k_1t}}\right|^2 \quad \text{Equation [7]}$$

The thickness of a thin film layer can be derived based upon best fit the simulated reflectivity using Equation [1]-[7] to the measured reflectance values that are obtained as described above as a function of angle of incidence. For multiple layers of films on a substrate, Equation [1]-[7] can be applied recursively to find the reflectivity of the whole film stack. Many nonlinear optimization algorithms can be used to find the best fit, such as Gaussian-Newton, or LM method.

The accuracy of the result can be further improved if an analysis is made which takes into account such factors as light absorption by the sample and the effect of a finite detector size. The amount of absorption varies from material to material. If the materials are known, various correction factors can be incorporated into Equation [1] and [7] to further refine the determination. Absorption correction can be easily done by replacing the index $n_S$, $n_L$ with $n_S+ik_S$ and $n_L+ik_L$ in Equation [1]-[7], and thus all mathematical operations are based on complex numbers, where k is the imagery part of the index that is related to absorption coefficient. A numerical solution may be sought using a least squares fitting routine, by way of example. Such a numerical analysis is greatly facilitated due to the fact that an approximate solution for layer thickness are typically known from the process information. Thus, a least squares fitting routine may be used to solve a set of Fresnel equations with inputting the likely solution for layer thickness. If the solution is refined in this manner, the accuracy of the measurement can be significantly improved.

The above operations are repeated for an xy position that is adjacent to the current TSV so as to obtain signals from a portion of the surface that does not include the TSV. In the example of FIG. 1B, an adjacent position may be located on surface 106 adjacent to TSV area 104a. In FIG. 1C, an adjacent position may be located on surface 107. Referring back to FIG. 6, the process 600 includes moving to an xy position that is adjacent to the current TSV in operation 610. The autofocus signal is used to adjust z position to obtain optimum focus and record the z position for the current xy position in operation 612. BPR measurements are then obtained at this current adjacent xyz position in operation 614. These BPR measurements are also used to find film thicknesses for the adjacent position (e.g., T1, T2, ... etc.) in operation 616. For instance, as shown in FIG. 7H, thickness values for T1 and T2 may be found for xy position 750b, which is adjacent to the TSV structure.

Since the spot size is rather small (e.g., 0.7 micron), the thicknesses will not substantially vary. In certain embodiments, the process 600 can be repeated for each position in a particular scan area, such as an area that is between about 5-10 micron by 5-10 micron. The spot can be moved with respect to this particular area in 1 micron increments, by way of example. Thus, many sets of measurements are obtained for a particular TSV area, and these measurements can be used to determined multiple sets of thicknesses for the particular area.

The height of the TSV (above the surrounding film surface) may also be determined based on the top and adjacent measurement results, recorded z positions, and specified film interface properties in operation 618. That is, the thicknesses and z positions that were obtained for the two xy positions can be used to determine the relative height of such xy positions.

For instance, the difference between the recorded heights of the first and second xy positions may be reported as a height for the TSV structure. This height may also be reported relative to a user-defined z reference. As shown in FIG. 7H, for example, the z reference can be set for the top of the layer having thickness T2. In general, the recorded z position pertains to the stage z position where autofocus signal outputs a desired value, for which the real beam focal point typically resides in the middle of the film stack. The position of the actual surface relative to beam focal point can be determined by an algorithm taking the determined thickness values as input for each xy position. The relative height of multiple xy positions can also be used as a metric for roughness.

Referring back to FIG. 6, it may then be determined whether there are more TSV structures in operation 620. If there are more TSV structures, the process 600 is repeated for a next TSV structure. Otherwise, the process ends.

Certain embodiments of the present invention utilize a BPR system with a small spot size that provides adequate spatial resolution and, thus, high accuracy for measuring film thicknesses and relative heights (or roughness metrics) for a rough surface. The high spatial resolution is associated with the high NA characteristics of the typical BPR system layout. The small spot size and fast measurement speed allows scanning of an area and measurement of multiple points in the area, which allows measurement of the surface roughness with high spatial resolution and isolation of roughness of different layers of the film. The BPR system is used to measure reflectance variation as a function of angle of incident (AOI), which provides a rich set of information that allows measurement of the film thicknesses and optical properties simultaneously without need of a dispersion model. Certain techniques described herein also provide a way to measure structure height with high accuracy since (a)

the high NA system provides high sensitivity to height, and (b) each of the film thicknesses can be isolated through analysis of the BPR signal.

The BPR system may take the form of a stand-alone system or be integrated into a cluster tool. In one specific implementation, a combination system enables measurement of TSV thickness on a semiconductor wafer using BPR and measurement of other metrology features (e.g., CD, overlay, film composition, etc.) or defect detection using reflectivity or scatteronmetry electromagnetic waveform or scanning electron microscope (SEM) images or signals on the same measurement system or using linked measurement systems sharing at least part of a robotic wafer handling system. The methods of measuring TSV structure properties and other metrology or inspection properties may be scheduled and performed on separate measurement systems. One disadvantage of methods of measuring such properties on separate measurement systems is the additional time required to schedule and run separate operations on separate metrology tools. Another disadvantage is the redundancy of common parts and the costs associated therewith.

In order to overcome these disadvantages, a metrology system that combines BPR and inspection/metrology may be provided. In one embodiment, the BPR and the inspection/metrology systems may be separate systems capable of independent operation, but linked in such a way that they share at least part of a robotic wafer handling system.

In operation, a wafer, a group of wafers, or batch of multiple wafers may be introduced to the combined metrology system by loading the wafer container onto the robotic wafer handling system dedicated to this combined metrology/inspection system. Measurement recipes may be selected specifying BPR measurements on some or all of the wafers and other metrology/inspection measurements on some or all of the wafers. The BPR measurements and the other metrology/inspection measurements may be specified together in one or more recipes, or may be specified in separate recipes. The BPR and other metrology/inspection measurements may be done on the same wafers or on different wafers or on some of the same wafer and some different wafers. The BPR and other metrology/inspection systems may operate in parallel, or in series.

Another example of a combined metrology system would be a linked system comprising a BPR system, another metrology/inspection such as any of those manufactured by KLA-Tencor of Milpitas, Calif., a robotic handler, and a wafer scheduling system. A BPR system may also be clustered with a process tool. Communication to factory automation and/or factory information, and/or factory process control systems may be through separate communication or automation systems or may be at least partially or completed shared.

One advantage of the combined BPR and other metrology/inspection system is the reduction in overall time required to complete scheduling and/or performing the BPR and other measurements. At least one queue delay time may be eliminated.

Figure 8A:
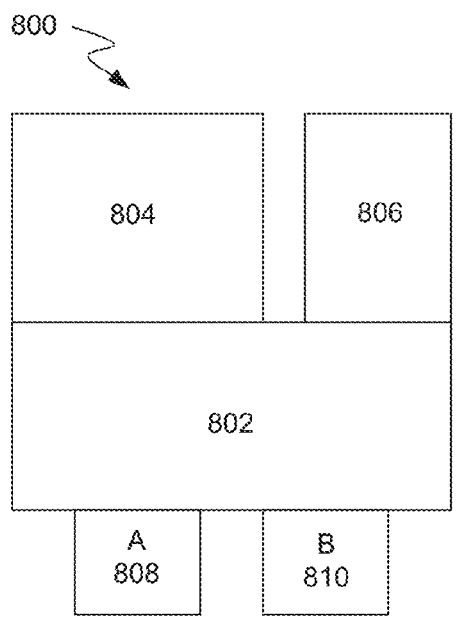
FIGS. 8A and 8B show variations of a combined metrology/inspection tool in accordance with two embodiment of the present invention.
Figure 8B:
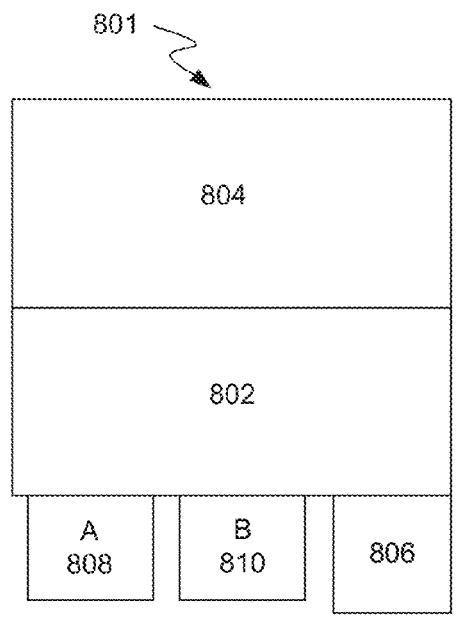

FIGS. 8A and 8B show variations of a combined metrology/inspection tool 800 and 801, respectively, in accordance with two embodiment of the present invention. In both figures, the combined metrology/inspection tool includes a robotic wafer handling system 802, a BPR module 804, another metrology/inspection module 806, a wafer load position A 808 and a wafer load position B and 810, respectively.

The robotic wafer handling system 802 is configured to transfer wafers to and from the BPR module 804 and metrology/inspection module 806 as well as to and from the wafer load positions A 808 and B 810. The BPR module 804 is configured to measure TSV properties, such as height, film thickness and roughness, etc. The metrology inspection module 806 may be configured to detect defects or measure any metric, such as overlay or critical dimensions, such as linewidth, top linewidth, via diameter, sidewall angle and profile. The wafer load position A and wafer load position B are configured to hold one or more wafers. In most cases, they hold a plurality of wafers. The wafers may be from the same lot or from a different lot.

In a specific implementation, the system 800 includes an inspector tool system (806) for obtaining intensity signals or images of a wafer. For example, the inspection tool may construct an optical image or generate intensity values of a portion of the wafer based on a portion of detected light that is reflected, transmitted, or otherwise directed to one or more light sensors. The inspection tool may then output the intensity values or images, as well as encoder position data, for defect detection analysis.

In FIGS. 8A and 8B, the BPR module 804 and the metrology/inspection module 806 are separate systems that are integrated via the robotic wafer handling system 802.

The BPR module may take any suitable form, such as the BPR system 400 of FIG. 4. The inspection/metrology module may take any suitable form for inspecting a sample with one or more electromagnetic waveforms to measure a property of the sample or to detect defects on such sample. Examples of an inspection system include specially configured 29xx, 8xxx, or 3xxx inspection system families available from KLA-Tencor of Milpitas, Calif.

In one process, some of the wafers from wafer load position A and/or B have TSV properties measured at the BPR module 804 and, thereafter, have other metrology or inspection properties measured at the metrology/inspection module 806. The wafer can be measured by both processes without being removed from the system, i.e., the wafer handling as well as the throughput issues associated therewith are reduced. In another operation, some wafers from wafer load position A and/or B have TSV properties measured at the BPR module 804 and some other wafers from wafer load position A and/or B have other metrology or inspection properties measured at the metrology/inspection module 806. In any of these operations, the BPR and metrology/inspection modules can proceed independently and simultaneously.

A group of wafers can be first received by either the BPR module 804 or inspection/metrology module 806. By way of example, the wafers may be a wafer lot that is loaded at position A 808. The TSV properties of a wafer from the group of wafers is measured by BPR module 804. Another metrology or inspection process on a wafer from the group of wafers may then be performed by metrology/inspection module 806. Such BPR and other metrology/inspection operations may be performed at the same time on different wafers. The transferring of the wafer may for example be performed by the robotic system 802 shown in FIGS. 8A and 8B. When all the measurements are performed, the group of wafers are released from the metrology tool, for example, at position B 810.

The above described BPR systems are not to limit the scope of the invention. The inventive techniques described herein may be implemented with respect to any suitable BPR system, such as the system of FIG. 4. In an alternative embodiment, the BPR system incorporates an illumination system that is operable to generate multiple wavelength ranges. In some embodiments of the disclosure, illumination beams from a plurality of illumination sources are combined to deliver illumination at one or more selected wavelengths to the measurement head. Different wavelength ranges may be selected for different film or substrate materials that become opaque or transparent at different wavelength ranges. That is, wavelength ranges that result in one or more of the test area films being transparent can be selected.

Figure 9:
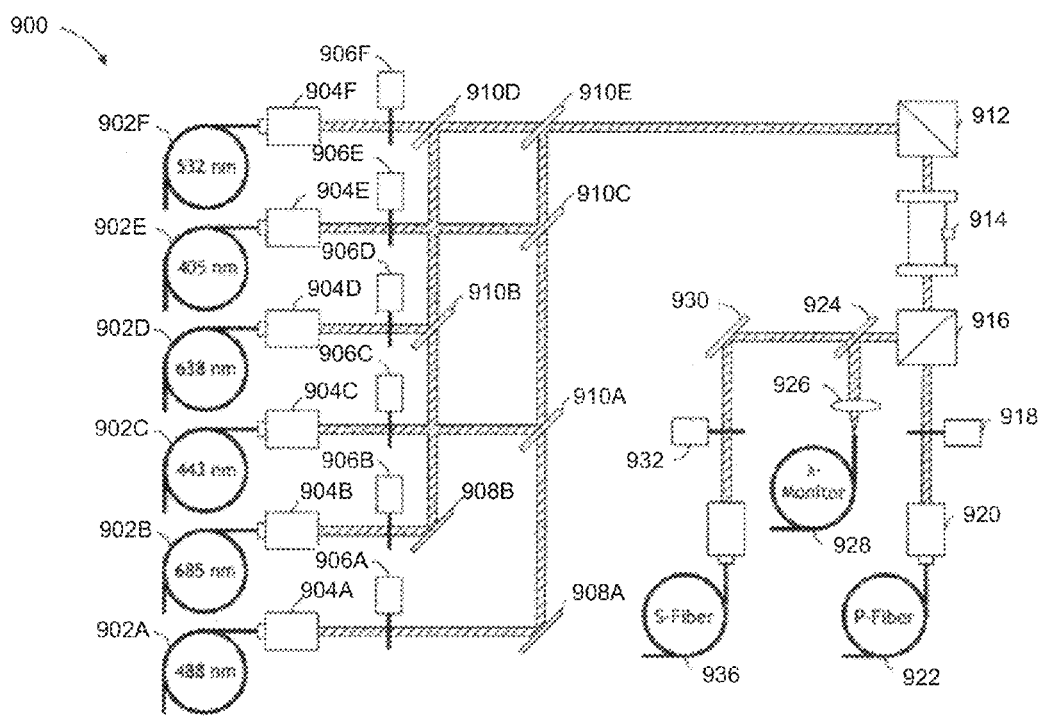
FIG. 9 illustrates an embodiment of a system for providing illumination to a measurement head of a BPR system utilizing a plurality of illumination sources in accordance with a specific implementation of the present invention.

Several multi-wavelength and multi-angles of incidence detector embodiments that can be used in the illustrated systems are described further in U.S. Pat. No. 7,667,841B2, issued 23 Feb. 2010 by Jon Opsal and U.S. Pat. No. 5,596,411, issued 21 Jan. 1997 by Jeffrey T. Fanton et al., which patents are incorporated herein by reference in their entirety for all purposes. FIG. 9 illustrates an embodiment of a system 900 for providing illumination to a measurement head of a BPR system utilizing a plurality of illumination sources 902 in accordance with a specific implementation of the present invention. Illumination emanating from the illumination sources 902 may be combined to propagate along a common illumination path utilizing a plurality of dichroic combiners 910. In an embodiment, the dichroic combiners 910 are configured to direct illumination along a free space illumination path. In some embodiments, at least a portion of the illumination path may be delineated by one or more optical elements, such as focusing lenses, beam splitters, combiners, mirrors, coupling lenses, optical fibers, attenuators, polarizers, collimation lenses, and the like.

In an embodiment, the system 900 includes, but is not limited to, a first illumination source 902A, a second illumination source 902B, a third illumination source 902C, a fourth illumination source 902D, a fifth illumination source 902E, and a sixth illumination source 902F. Each illumination source 902 may be configured to provide illumination at a selected wavelength or a selected range of wavelengths. In an exemplary embodiment, the first illumination source 902A, second illumination source 902B, third illumination source 902C, fourth illumination source 902D, fifth illumination source 902E, and sixth illumination source 902F may be configured to provide illumination at 488 nm, 685 nm, 443 nm, 638 nm, 405 nm, and 532 nm wavelengths, respectively. It is noted herein that the foregoing exemplary embodiment is included for illustrative purposes and should not be construed as a limitation on the present disclosure. In other embodiments, illumination sources 902 configured to provide illumination at an alternative set of wavelengths may be selected.

The illumination sources 902 may be configured to transmit illumination through respective collimation lenses 904 to a guide path delineated by optical elements, including but not limited to, fold mirrors 908 and dichroic combiners 910. The system 900 may further include shutters 906 disposed between the illumination sources 902 and the guide path. The shutters 906 may be configured to allow illumination from at least one selected illumination source 902 to be transmitted to the guide path while blocking illumination from other illumination sources 902. In an embodiment, a shutter 906 corresponding to an illumination source 902 emanating illumination at a selected wavelength may open to let through illumination at the selected wavelength while all other shutters 906 remain closed to block illumination at other wavelengths emanating from the other illumination sources 902.

In an embodiment, the guide path may include, but is not limited to, two fold mirrors and five dichroic combiners in the compact arrangement illustrated in FIG. 9 and described herein. A first fold mirror 908A may be configured to reflect illumination from the first illumination source 902A towards a first dichroic combiner 910A. A second fold mirror 908B may be configured to reflect illumination from the second illumination source 902B towards a second dichroic combiner 910B.

A dichroic combiner 910 may be configured to transmit illumination at wavelengths above or below a selected threshold while reflecting illumination at other wavelengths. Alternatively, a dichroic combiner 910 may be configured to transmit illumination at wavelengths within or outside of a selected range while reflecting illumination at other wavelengths. The first dichroic combiner 910A may be configured to transmit illumination from the first illumination source 902A towards a third dichroic combiner 910C. The first dichroic combiner 910A may be further configured to reflect illumination from the third illumination source 902C towards the third dichroic combiner 910C.

The second dichroic combiner 9108 may be configured to transmit illumination from the second illumination source 902B towards a fourth dichroic combiner 910D. The second dichroic combiner 910B may be further configured to reflect illumination from the fourth illumination source 902D towards the fourth dichroic combiner 910D.

The third dichroic combiner 910C may be configured to transmit illumination from the first illumination source 902A and illumination from the third illumination source 902C towards a fifth dichroic combiner 910E. The third dichroic combiner 910C may be further configured to reflect illumination from the fifth illumination source 902E towards the fifth dichroic combiner 910E.

The fourth dichroic combiner 910D may be configured to transmit illumination from the sixth illumination source 902F towards the fifth dichroic combiner 910E. The fourth dichroic combiner 910D may be further configured to reflect illumination from the second illumination source 902B and illumination from the fourth illumination source 902D towards the fifth dichroic combiner 910E.

The fifth dichroic combiner 910E may be configured to transmit illumination from the second illumination source 902B, illumination from the fourth illumination source 902D, and illumination from the sixth illumination source 902F along the illumination path to the measurement head of the optical metrology system. The fifth dichroic combiner 910E may be further configured to reflect illumination from the first illumination source 902A, illumination from the third illumination source 902C, and illumination from the fifth illumination source 902E along the illumination path to the measurement head.

In an embodiment, the illumination path may include one or more polarizing beam splitters 912, 916 disposed before and/or after an intensity control module 914. The intensity control module may include an electro-optical device, such as a Pocket's cell, configured to attenuate intensity of illumination delivered along the illumination path to the measurement head. At least one polarizing beam splitter 916 may be configured to direct a portion of illumination along a delivery path to a single-mode or multi-mode optical fiber 922 configured to deliver the portion of illumination to a polarization channel of the measurement head. The polarizing beam splitter 916 may be further configured to direct at least one additional portion of illumination along an additional delivery path to an optical fiber 936 configured to deliver the additional portion of illumination to an additional polarization channel of the measurement head. The delivery paths may include additional optical elements to define a path and/or control illumination propagating along the path. For example, a fold mirror 930 may be configured to reflect illumination along a selected path. Shutters 918, 934 may be configured to selectively transmit or block illumination delivered to the optical fibers 922, 936. Coupling lenses 920, 934 may be configured to transfer illumination from free space to the optical fibers 922, 936. A beam splitter 924 may be configured to direct a small portion of illumination from the illumination path or delivery path to a wavelength monitor 928 through a lens 926, optical fiber, and/or any other optical elements. The foregoing examples are provided for illustrative purposes only. It is contemplated that various optical elements may be included or excluded without departing from the essence of the present disclosure.

In this system and other system, a two-dimensional detector may be used in place of the two linear arrays or in place of each linear array so as to collect more detected information to result in a more robust solution. Additionally, different axis of a 2D detector can be used for different angles of incidence and different wavelength ranges. Other types of detectors include quad-cell detectors, CCD arrays, etc.

In general, to obtain encoder location data an instruction may be sent to the stage encoder system to record xyz position data into one or more encoder buffers, and then another instruction is sent to the stage encoder system to dump or "write" the xyz position data from the encoder buffers into the system memory.

While the xyz encoder system can be instructed to record real-time xyz encoder position data and write such data to the system memory as a swath is scanned, special firmware may be configured to enable real-time bi-directional communication. Alternatively, a sequential read/write technique would also work so that the system uses the scan turnaround time for writing and obtaining xyz encoder position data.

Regardless of the system configuration, one or more controller may be utilized to control various aspects of the system. For instance, the signals captured by each sensor can be processed by a controller system, such as by one or more signal processing devices, which may each include an analog-to-digital converter configured to convert analog signals from each sensor into digital signals for processing. The controller system may include one or more processors coupled to input/output ports, and one or more memories via appropriate buses or other communication mechanisms.

The controller system may also include one or more input devices (e.g., a keyboard, mouse, joystick) for providing user input, such as changing focus and other metrology and/or inspection recipe parameters. The controller system may also be connected to the stage positioning mechanism for controlling, for example, a sample position (e.g., focusing and scanning) and connected to other inspection/metrology system components for controlling other inspection parameters and configurations of such components.

The controller system may be configured (e.g., with programming instructions) to provide a user interface (e.g., a computer screen) for displaying resultant intensity values, images, and other inspection/metrology results. The controller system may be configured to generate images and/or other displayed signals. The controller system may be configured (e.g., with programming instructions) to provide a user interface (e.g., on a computer screen) for displaying resultant intensity values, images, plots, projections, and other inspection/metrology characteristics. In certain embodiments, the controller system is configured to carry out metrology and/or inspection techniques detailed above.

Because such information and program instructions may be implemented on a specially configured computer system, such a system includes program instructions/computer code for performing various operations described herein that can be stored on a non-transitory computer readable media. Examples of machine-readable media include, but are not limited to, magnetic media such as hard disks, floppy disks, and magnetic tape; optical media such as CD-ROM disks; magneto-optical media such as optical disks; and hardware devices that are specially configured to store and perform program instructions, such as read-only memory devices (ROM) and random access memory (RAM). Examples of program instructions include both machine code, such as produced by a compiler, and files containing higher level code that may be executed by the computer using an interpreter.

Although the foregoing invention has been described in some detail for purposes of clarity of understanding, it will be apparent that certain changes and modifications may be practiced within the scope of the appended claims. It should be noted that there are many alternative ways of implementing the processes, systems, and apparatus of the present invention. Accordingly, the present embodiments are to be considered as illustrative and not restrictive, and the invention is not to be limited to the details given herein.

What is claimed is:

1. A method for measuring a characteristics of a through-silicon via (TSV) structure, the method comprising:
   using a beam profile reflectivity (BPR) tool to move to a first xy position having a TSV structure;
   using the BPR tool to obtain an optimum focus at the first xy position by adjusting the z position to a first optimum z position for obtaining measurements at the first xy position;
   via the BPR tool, obtaining reflectivity measurements for a plurality of angles of incidence at the first xy position; and
   determining one or more film thicknesses for the TSV structure based on the reflectivity measurements.

2. The method of claim 1, further comprising:
   recording the first optimum z position from a stage encoder of the BPR tool;
   using the BPR tool to move to a second xy position adjacent to the TSV structure;
   using the BPR tool to obtain an optimum focus at the second xy position by adjusting the z position to a second optimum z position for obtaining measurements at the second xy position;
   recording the second optimum z position from the stage encoder of the BPR tool;
   via the BPR tool, obtaining reflectivity measurements for a plurality of angles of incidence at the second xy position;
   determining one or more film thicknesses for the second xy position that is adjacent to the TSV structure based on the reflectivity measurements; and
   determining a height difference between the TSV structure and the second xy position based on the recorded first and second optimum z positions and the film thicknesses determined for the first and second xy positions.

3. The method of claim 2, wherein the measurements for the first and second xy positions are obtained for s and p polarizations.

4. The method of claim 2, wherein the film thicknesses for the first and second xy positions are determined by solving for a set of Fresnel coefficients in a set of Fresnel equations that each relates reflectivity, angle of incidence, and thickness.

5. The method of claim 4, wherein solving for the set of Fresnel coefficients includes employing a least squares fitting routine to the set of Fresnel equations and correcting for absorption characteristics of one or more films at the first and second xy positions.

6. The method of claim 4, further comprising, for a plurality of adjacent xy positions, repeating the operations for using the BPR tool to move, using the BPR tool to obtain an optimum focus, recording an optimum z position, obtaining reflectivity measurements, determining one or more film thicknesses, and determining height differences so as to obtain a roughness metric for the plurality of adjacent xy positions.

7. The method of claim 6, wherein the adjacent xy positions cover an area between about 5-10 microns by 5-10 microns or more.

8. A beam profile reflectivity (BPR) system for measuring a characteristics of a through-silicon via (TSV) structure, comprising:
   an illumination optics module for generating and directing an incident beam towards a sample at a plurality of angles of incidence;
   a collection optics module for obtaining reflectivity measurements from the sample in response to the incident beam; and
   a controller that is configured to perform the following operations:
      moving to a first xy position having a TSV structure;
      obtaining an optimum focus at the first xy position by adjusting the z position to a first optimum z position for obtaining measurements at the first xy position;
      obtaining reflectivity measurements for a plurality of angles of incidence at the first xy position; and
      determining one or more film thicknesses for the TSV structure based on the reflectivity measurements.

9. The system of claim 8, wherein the controller is further configured for:
   recording the first optimum z position from a stage encoder of the BPR tool;
   moving to a second xy position adjacent to the TSV structure;
   obtaining an optimum focus at the second xy position by adjusting the z position to a second optimum z position for obtaining measurements at the second xy position;
   recording the second optimum z position from the stage encoder of the BPR tool;
   obtaining reflectivity measurements for a plurality of angles of incidence at the second xy position;
   determining one or more film thicknesses for the second xy position that is adjacent to the TSV structure based on the reflectivity measurements; and
   determining a height difference between the TSV structure and the second xy position based on the recorded first and second optimum z positions and the film thicknesses determined for the first and second xy positions.

10. The system of claim 9, wherein the measurements for the first and second xy positions are obtained for s and p polarizations.

11. The system of claim 9, wherein the film thicknesses for the first and second xy positions are determined by solving for a set of Fresnel coefficients in a set of Fresnel equations that each relates reflectivity, angle of incidence, and thickness.

12. The system of claim 11, wherein solving for the set of Fresnel coefficients includes employing a least squares fitting routine to the set of Fresnel equations and correcting for absorption characteristics of one or more films at the first and second xy positions.

13. The system of claim 11, wherein the controller is further to, for a plurality of adjacent xy positions, repeat the operations for using the BPR tool to move, using the BPR tool to obtain an optimum focus, recording an optimum z position, obtaining reflectivity measurements, determining one or more film thicknesses, and determining height differences so as to obtain a roughness metric for the plurality of adjacent xy positions.

14. The system of claim 13, wherein the adjacent xy positions cover an area between about 5-10 microns by 5-10 microns or more.

15. The system of claim 8, wherein the illumination module is configured to generate the incident beam at a plurality of wavelength ranges, and the controller is further configured to select a wavelength range for specific film types.

16. A cluster system for performing metrology and inspection on a sample, comprising:
   an inspection tool for inspecting a sample for defects;
   the BPR system of claim 8; and
   a wafer handling system for moving one or more samples between the inspection tool and the BPR system.

17. A cluster system for performing metrology and processing on a sample, comprising:
   a processing tool for performing a fabrication process on a sample;
   the BPR system of claim 8; and
   a wafer handling system for moving one or more samples between the processing tool and the BPR system.

* * * * *

UNITED STATES PATENT AND TRADEMARK OFFICE
CERTIFICATE OF CORRECTION

PATENT NO. : 9,709,386 B1
APPLICATION NO. : 15/091522
DATED : July 18, 2017
INVENTOR(S) : Nicolaides et al.

Page 1 of 1

It is certified that error appears in the above-identified patent and that said Letters Patent is hereby corrected as shown below:

In the Claims

Claim 13, Column 20, Line 20, change "further to" to -- further configured to --.

Signed and Sealed this
Seventh Day of November, 2017

Joseph Matal
*Performing the Functions and Duties of the
Under Secretary of Commerce for Intellectual Property and
Director of the United States Patent and Trademark Office*